(12) United States Patent
Kim et al.

(10) Patent No.: US 7,675,562 B2
(45) Date of Patent: Mar. 9, 2010

(54) CMOS IMAGE SENSOR INCLUDING COLUMN DRIVER CIRCUITS AND METHOD FOR SENSING AN IMAGE USING THE SAME

(75) Inventors: Yo-Jong Kim, Yongin-si (KR);
Chang-Sik Choi, Yongin-si (KR);
Chi-Young Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1124 days.

(21) Appl. No.: 10/782,862

(22) Filed: Feb. 23, 2004

(65) Prior Publication Data

US 2005/0041129 A1 Feb. 24, 2005

(30) Foreign Application Priority Data

Aug. 23, 2003 (KR) .................. 10-2003-0058463

(51) Int. Cl.
*H04N 5/335* (2006.01)
(52) U.S. Cl. .................................................. 348/308
(58) Field of Classification Search ........ 348/308, 348/310, 241, 243
See application file for complete search history.

(56) References Cited

U.S. PATENT DOCUMENTS 5,184,018 A * 2/1993 Conrads et al. ........ 250/370.09
5,654,537 A * 8/1997 Prater ...................... 250/208.1
6,180,969 B1 * 1/2001 Yang et al. .................. 257/291
7,102,677 B2 * 9/2006 Watanabe .................... 348/308

FOREIGN PATENT DOCUMENTS

KR 2003-0067490 8/2003

OTHER PUBLICATIONS

Korean Office Action dated Jun. 21, 2005.

* cited by examiner

*Primary Examiner*—Jason Chan
*Assistant Examiner*—Nicholas G Giles
(74) *Attorney, Agent, or Firm*—Harness, Dickey & Pierce, P.L.C.

(57) ABSTRACT

The image senor includes a plurality of row lines and a plurality of column lines crossing the plurality of row lines. A pixel is formed at respective crossings of the row and column lines. Each pixel generates a charge based on light incident thereon and selectively transfers the charge to an associated column line based on a signal received from an associated row line. Each column line has a column driver circuit associated therewith. The column driver circuit is configured to generate an output voltage based on the charge on the associated column line.

26 Claims, 6 Drawing Sheets

CMOS IMAGE SENSOR INCLUDING COLUMN DRIVER CIRCUITS AND METHOD FOR SENSING AN IMAGE USING THE SAME

CROSS-REFERENCE TO RELATED APPLICATIONS

This application relies for priority upon Korean Patent Application No. 2003-58463 filed on Aug. 23, 2003, the contents of which are herein incorporated by reference in its entirety.

BACKGROUND OF THE INVENTION

1. Field of the Invention

The present invention relates to a CMOS (Complementary Metal Oxide Silicon) image sensor and a method for sensing an image using the same.

2. Description of the Related Art

A photo detector detects light, converts the detected light into an electrical signal, and outputs an image signal. For example, the photo detector may be included in a CCD (Charge Coupled Device) or a CMOS image sensor.

The CCD includes a light-sensitive element such as a photo diode, a charge transmission element and a signal output element. The photo diode detects light and generates a charge signal (or a photo charge) that is indicative of the amount of light received by the photo diode. The charge transmission element transmits the charge signal generated from the photo diode without signal loss to the signal output element. The signal output element accumulates the charge signal, and outputs an analog voltage signal in proportion to the quantity of the charge signal.

The CCD sequentially transmits the charge signal to neighboring pixels, but does not randomly access the pixels.

A CMOS image sensor has a few advantages over the CCD. In particular, the fabrication process of the CMOS image sensor is simpler than that of the CCD. In addition the CMOS image sensor employs a correlated double sampling circuit to greatly reduce a reset noise caused by resetting the charges accumulated from the photo diodes.

The correlated double sampling circuit samples a reset voltage of a pixel, and then samples a signal voltage. An output of the correlated double sampling circuit equals the difference between the reset voltage and the signal voltage. Thus, the correlated double sampling circuit may reduce fixed pattern noises due to threshold voltage differences of the transistors in pixels, and the correlated double sampling circuit reduces the reset noise due to the reset voltage differences.

One example of a pixel in the CMOS image sensor has a photo diode and four transistors. The four transistors function to transfer charge from the photo diode to the correlated double sampling circuit and to reset the accumulated charge. FIG. 1 illustrates an example of a CMOS image sensor having a photo diode and four transistor structure. As shown, a plurality of row lines 115 cross a plurality of column lines 113. At respective crossing, pixels 101 having a photo diode and four transistor structure are formed. As further shown, reset lines 117 provide reset signals Rs for causing the pixels 101 to reset their charges, and selection lines 119 provide selection signals RSEL for causing pixels to transfer charges to an associated column line 113.

The CMOS image sensor having pixels of the four-transistor structure has an advantage that noise is reduced, but has a disadvantage that the fill factor of the pixel is low. In other words, the area occupied by the photo diode in one pixel is relatively reduced since the pixel includes four transistors. An increased number of pixels and a decreased area occupied by a unit pixel may lead to a CMOS image sensor of high resolution. A low fill factor leads to a decrease in the area occupied by the photo diode. This decreased area occupied by the photo diode reduces the quantity of the electron-hole pairs generated by light incident on the photo diode, and thus the quantum efficiency (Q.E.) of the CMOS image sensor decreases. Therefore, the decreased quantum efficiency of the CMOS image sensor deteriorates the sensitivity of the CMOS image sensor.

SUMMARY OF THE INVENTION

The present invention provides an image sensor and method of image sensing.

In an exemplary embodiment, the pixels of the image sensor have a reduced number of transistors. This has the advantage of providing for an increased fill factor.

In another exemplary embodiment, column lines of the image sensor receive the charges generated by the pixels, and a reset circuit is associated with each column line. Each reset circuit is configured to reset the charges generated by the pixels associated with the same column line. Accordingly, a reset operation may be performed while maintaining a reduced number of transistors in an individual pixel. This promotes an increased fill factor and/or greater pixel density.

In one exemplary embodiment, the image senor includes a plurality of row lines and a plurality of column lines crossing the plurality of row lines. A pixel is formed at respective crossings of the row and column lines. Each pixel generates a charge based on light incident thereon and selectively transfers the charge to an associated column line based on a signal received from an associated row line. Each column line has a column driver circuit associated therewith. The column driver circuit is configured to generate an output voltage based on the charge on the associated column line.

For example, the pixel may include a transfer transistor for transferring the charge produced by a photo diode to an associated column line.

In another exemplary embodiment, the image sensor includes a plurality of row lines and a plurality of column lines crossing the plurality of row lines. A pixel is formed at respective crossings of the row and column lines. Each pixel generates a charge based on light incident thereon and selectively transfers the charge to an associated column line based on a signal received from an associated row line. Each column line has a reset circuit associated therewith. Each reset circuit is configured to reset the charge of each pixel associated with the associated column line.

For example, a reset circuit may include a transistor for applying a supply voltage to the associated column line.

In an exemplary embodiment of the image sensing method of the present invention, voltages are applied to the column lines based on the charges generated by in the pixels. Then, for each column line, a data voltage is generated as an output voltage based on the applied voltage.

In one exemplary embodiment, prior to the applying step, the charge of each pixel is reset.

BRIEF DESCRIPTION OF THE DRAWINGS

The above and other features and advantages of the present invention will become more apparent by describing in detail exemplary embodiments thereof with reference to the accompanying drawings, in which.

DESCRIPTION OF EMBODIMENTS

Figure 1:
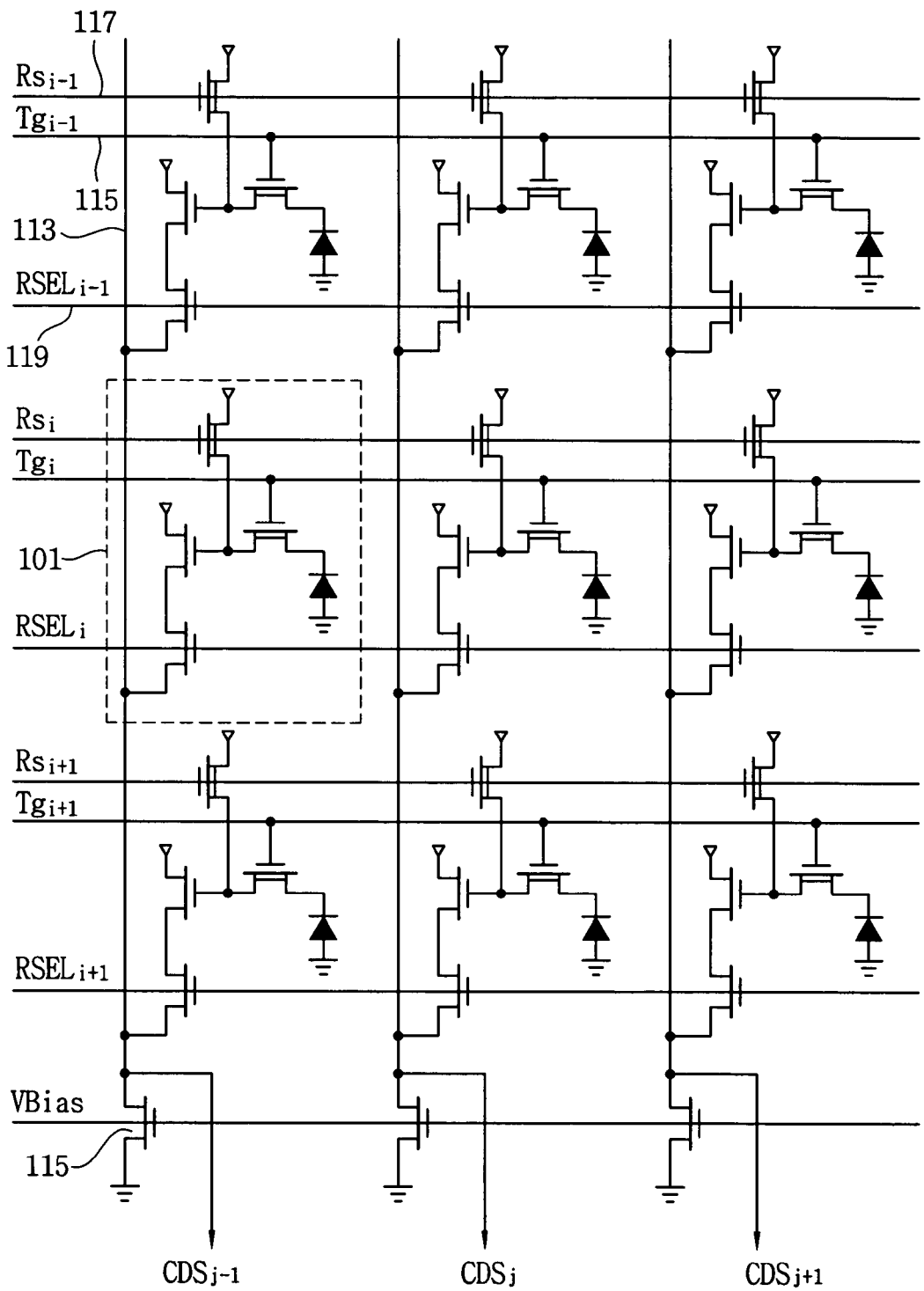
FIG. 1 illustrates an example of a prior art CMOS image sensor having a photo diode and four transistor structure.

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Embodiment 1

Figure 2:
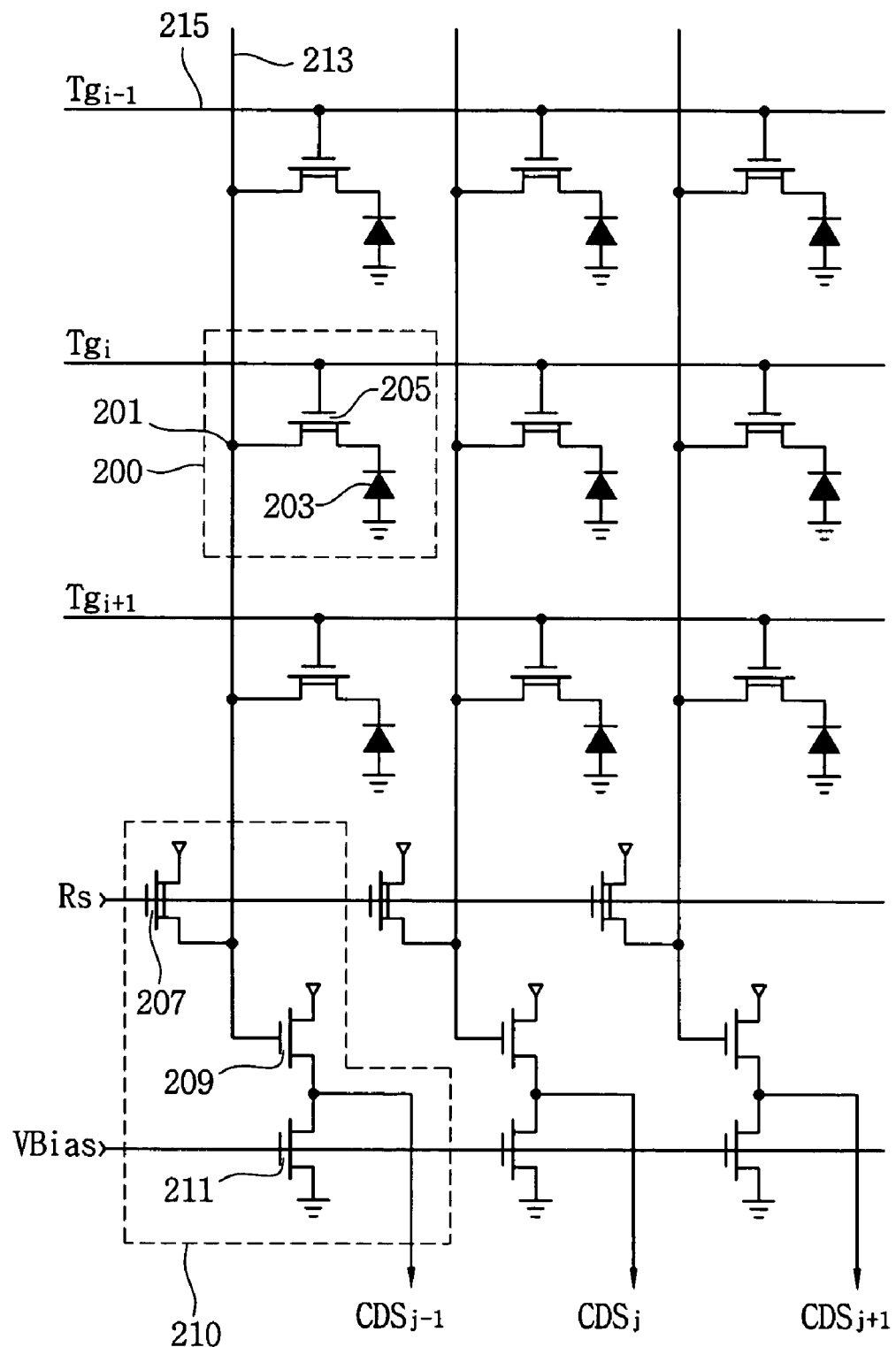
FIG. 2 is a circuit diagram showing pixels and column driver circuit of a CMOS image sensor according to a first exemplary embodiment of the present invention.

FIG. 2 is a circuit diagram showing pixels and a column driver circuit of a CMOS image sensor according to a first exemplary embodiment of the present invention.

Referring to FIG. 2, a plurality of row lines 215 and a plurality of column lines 213 define a matrix and a pixel 200 is located at respective crossings of the row and column lines 215 and 213. Each of the pixels 200 comprises a photoelectric transformation element 203 and a switching element 205. For example, the photoelectric transformation element 203 has a photo diode or a photo gate light sensitive region. In the photo gate light sensitive regions, a photo gate electrode is disposed over the photo diode so that the charge signal (or photo charge) accumulated at the photo diode may be transmitted to a sensing node 201, which in this embodiment is on the associated column line 213. Namely, the sensing node 201 stores the charge signal generated by the photo diode while a data voltage is detected, and generates a voltage signal corresponding to the stored charges. As described in detail below, the charges accumulated at the sensing node 210 are discharged during a reset operation.

The switching element 205 may be an NMOS transistor or a PMOS transistor. The switching element 205 may be a depletion mode MOSFET (Metal Oxide Silicon Field Effect Transistor) or an enhancement mode MOSFET. A conductive channel is formed under a gate electrode (or a control electrode) of the depletion mode MOSFET. The depletion mode MOSFET already has the conductive channel through which current may flow between a source electrode and a drain electrode of the depletion mode MOSFET, and thus the charge signal is easily transferred to the sensing node 201.

The depletion mode MOSFET 205 is referred to as a transfer transistor since the charge signal generated from the photo diode is transferred to the sensing node 201 by the depletion mode MOSFET 205.

A gate electrode of the transfer transistor 205 is connected to a row line 215, a source electrode of the transfer transistor 205 is connected to an anode of the photo diode, and a drain electrode of the transfer transistor 205 is connected to the sensing node 201.

As further shown in FIG. 2, each of the column lines 213 includes a column driver circuit 210. Each column driver circuit 210 includes a reset control circuit 207, a driver circuit 209 and an output load 211. The reset control circuit 207 performs a reset operation by discharging charges of the sensing nodes 201. The driver circuit 209 is controlled by the voltage level at the sensing nodes 201, and outputs one of a reference voltage and a data voltage based on the voltage level of the sensing nodes 201. Hereinafter, the reference voltage is referred to as an output voltage of the pixel when the reset control circuit 207 is turned on, and the data voltage is referred to as an output voltage of the pixel when the reset control circuit 207 is turned off and the transfer transistor 205 is turned on. The output load 211 is coupled to an output terminal of the driver circuit 209, and maintains the output of the driver circuit 209 above a given voltage level.

The reset control circuit 207 may include a reset transistor. For example, as shown in FIG. 2, the reset transistor 207 comprises a depletion mode NMOS transistor. A drain electrode of the reset transistor 207 is coupled to a power or supply voltage Vdd, and a source electrode of the reset transistor 207 is coupled to a column line 213. The reset transistor 207 is turned on or turned off in response to a reset control signal Rs received at a gate electrode of the reset transistor 207.

The driver circuit 209 may include a driver transistor. For example, the driver transistor 209 is an enhancement mode NMOS transistor. A drain electrode of the driver transistor 209 is coupled to the power voltage Vdd, and a source electrode of the driver transistor 209 is connected to the output load 211. A gate electrode of the driver transistor 209 is connected to the column line 213, and is controlled by the voltage level of the column line 213. The driver transistor 209 operates in a saturation region as a source follower amplifier during a reset operation or when the transfer transistor 205 is turned on.

The output load 211 may include a bias transistor. For example, as shown in FIG. 2, the bias transistor 211 is an enhancement mode NMOS transistor. A source electrode of the bias transistor 211 is connected to a ground, and a drain electrode of the bias transistor 211 is connected to the source electrode of the drive transistor 209. The gate of the bias transistor 211 receives a bias Vbias. The bias transistor 211 acts as a constant current source and as an output transistor of a current mirror (not shown) when the bias transistor 211 operates in the saturation region. Thus, the bias transistor 211 acts as an active load.

The voltage of the source electrode of the driver transistor 209 is an output of the column driver circuit 210. The output of the column driver circuit 210 is sampled by a correlated double sampling circuit CDS (not shown).

Figure 3:
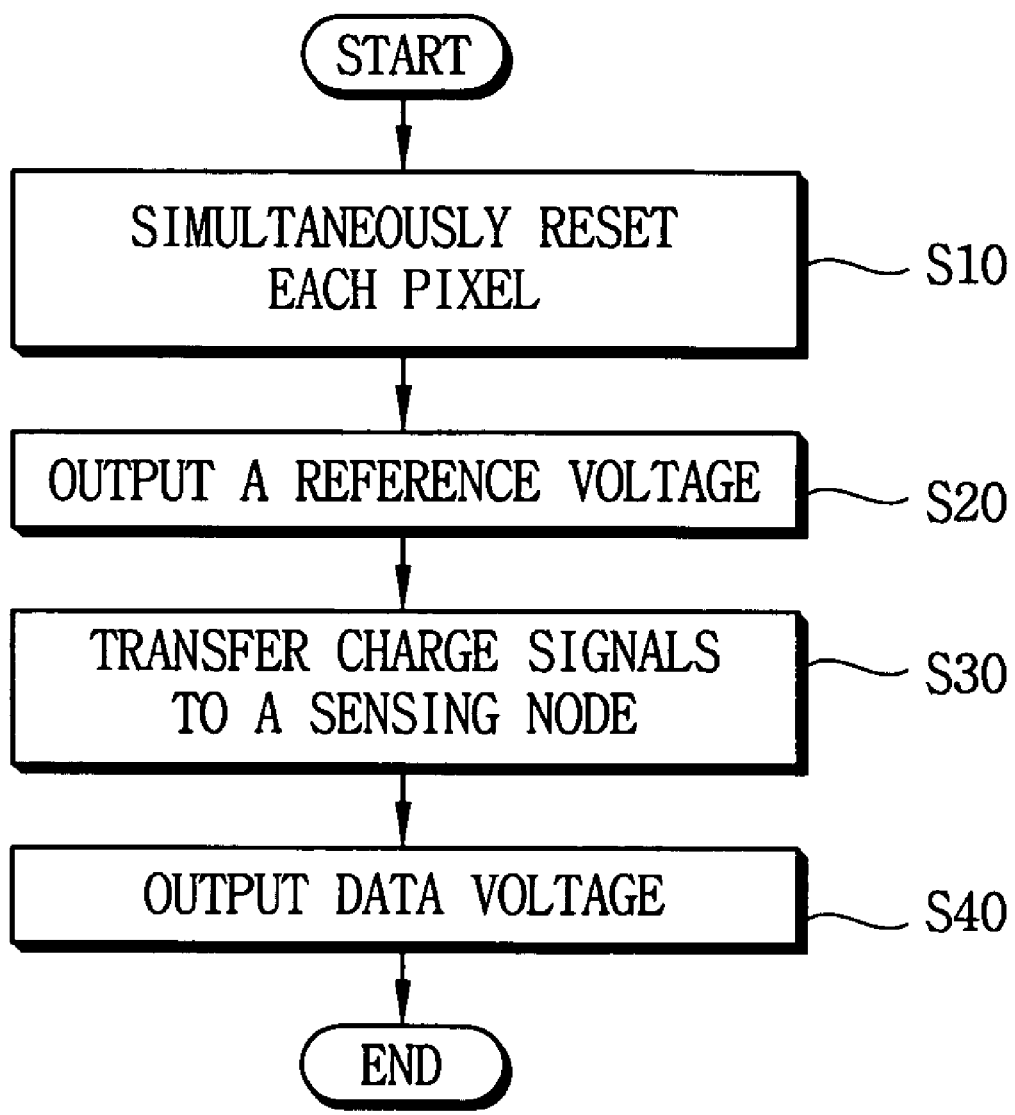
FIG. 3 is a flow chart showing a CMOS image sensing method using the CMOS image sensor of FIG. 2.
Figure 4:
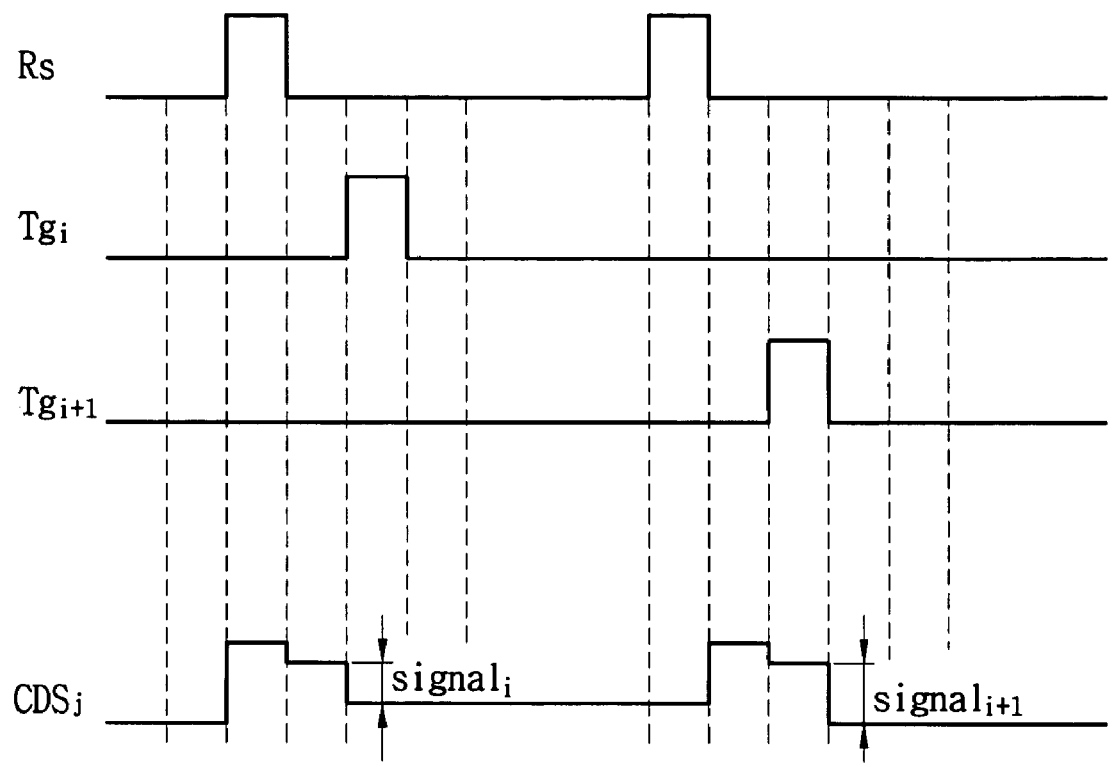
FIG. 4 is a timing diagram showing the operation of the CMOS image sensor of FIG. 2.

FIG. 3 is a flow chart showing a CMOS image sensing method using the CMOS image sensor of FIG. 2, and FIG. 4 is a timing diagram showing the operation of the CMOS image sensor of FIG. 2.

Referring to FIGS. 3 and 4, when a reset control signal Rs has a high level, the reset transistor 207 in each column driver circuit 210 is turned on and a reset operation begins. Since the drain electrode of the reset transistor 207 has the voltage level of the power voltage Vdd, a voltage difference is formed between the source and drain electrodes of the reset transistor 207 when electrons remain at the sensing node 201. Thus, the electrons remaining at the sensing node 201 are attracted toward the drain electrode of the reset transistor 207 via the conductive channel. The electrons remaining at the sensing node 201 are discharged toward the power voltage (Vdd) source, and the voltage level of the sensing node 201 has substantially the same level as that of the power voltage Vdd.

The above reset operation is simultaneously performed on each of the pixels of the CMOS image sensor (step S10).

The driver transistor 209 operates in a saturation region because the voltage level of the sensing node 201 is about Vdd. In order that the driver transistor 209 may operate in the saturation region, Vgs of the driver transistor 209 needs to be higher than a threshold voltage (Vth) of the driver transistor 209 and Vgd of the driver transistor 209 needs to be lower than the threshold voltage (Vth) of the driver transistor 209 when the driver transistor 209 is an enhancement mode MOSFET.

As a result of the reset operation, the driver transistor 209 outputs the reference voltage (step S20).

The bias transistor 211 acts as a constant current source. In order that the driver transistor 209 may supply a constant current, Vgs' of the bias transistor 211 is determined based on the condition in which $Ids=K(Vgs'-Vth)^2$, wherein Ids is the drain-source current of the driver transistor 209. The bias transistor 211 operates in the saturation region, and the output voltage of the pixel is set at a given DC level. Thus, the reference voltage is Vdd−Vgs, and the reference voltage is input to a correlated double sampling circuit CDS.

Each of the column lines 213 is coupled to a correlated double sampling circuit CDS. The correlated double sampling circuit CDS samples the reference voltage and the data voltage, and outputs the difference between the reference voltage and the data voltage. In other words, an output of the correlated double sampling circuit equals the difference between the reference voltage and the data voltage.

When the reset transistor 207 is turned off and light is applied to a photo diode 203, electron-hole pairs (EHPs) are generated. The photo diode 203 has a PN junction, and a depletion area is formed at the PN junction. The electrons recombine with the holes in the depletion area and disappear. An N type semiconductor has a plurality of positive ions, and a P type semiconductor has a plurality of negative ions, thus the potential of the N type semiconductor is higher than the potential of the P type semiconductor in the depletion area. As a result, an electric field is formed from the N type semiconductor to the P type semiconductor in the depletion area. The electrons of the EHPs generated from the P type semiconductor are attracted toward the N type semiconductor to be accumulated at the N type semiconductor by the electric field formed in the depletion area of the PN junction.

When a row line selection signal Tg has a high level, the transfer transistors 205 connected thereto are turned on. The charges generated by the photo diodes 203 associated with these transfer transistors 205 are transferred to the respective sensing nodes 201 via the transfer transistors 205 (step S30). Since the sensing nodes 201 have the voltage level of the power voltage Vdd because of the reset operation, there is formed a voltage difference between the source and drain electrodes of each transfer transistor 205 that is turned on. Thus, the electrons accumulated at the source electrodes of the transfer transistors 205 are attracted toward the drain electrodes of the transfer transistors 205. The potential of the drain electrodes (or the sensing nodes 201) of the transfer transistors 205 decreases due to the movement of the electrons.

The potential of the gate electrode of a driver transistor 209 decreases according to above described process, and the potential decrease of the gate electrode of the driver transistor 209 is reflected at the output of the driver transistor 209 since the driver transistor 209 acts as the source follower amplifier in the saturation region.

Since the small signal voltage gain of the source follower amplifier is about 1, the voltage variation of the gate electrode of the driver transistor 209 is substantially the same as the voltage variation of the source electrode of the driver transistor 209. Thus, the potential decrease of the gate electrode of the driver transistor 209 leads to a potential decrease of the source electrode of the driver transistor 209, and the potential decrease of the source electrode of the driver transistor 209 is input as the data voltage to a correlated double sampling circuit. Namely, the data voltage is sampled by the correlated double sampling circuit (step S40). Since the correlated double sampling circuit outputs the voltage difference between the reference voltage and the data voltage, the resulting image data corresponds to the difference between the reference voltage and the data voltage.

An image signal sensed by the photo diode 203 may be represented by the variations in the difference between the reference voltage and the data voltage. In order to enhance the sensitivity of the image sensor, the variations in the difference between the reference voltage and the data voltage are increased and the driver transistor 209 is operated in the saturation region. That is, the voltage level of the sensing node 201 (or the gate electrode of the driver transistor 209) is higher than the threshold voltage Vth of the driver transistor 209 before application of the selection signal $T_{g+1}$ for the next row line.

When a small amount of light is incident on the photo diode 203, the amount of the generated EHPs is small. Thus, the voltage variation at the gate electrode of the driver transistor 209 is small, and the difference between the reference voltage and the data voltage is small. When a large amount of light is incident on the photo diode 203, the amount of the generated EHPs is large, and the difference between the reference voltage and the data voltage is large.

After the image sensing operation is performed on a row line, the image sensing operation is performed on a next row line. Thus, the signal Rs has a high level and the reset operation is performed before application of the selection signal $T_{g+1}$ for the next row line. In an example embodiment, the reset signal Rs is a periodic signal, and therefore the reset operation is performed periodically on each pixel of the image sensor.

Embodiment 2

Figure 5:
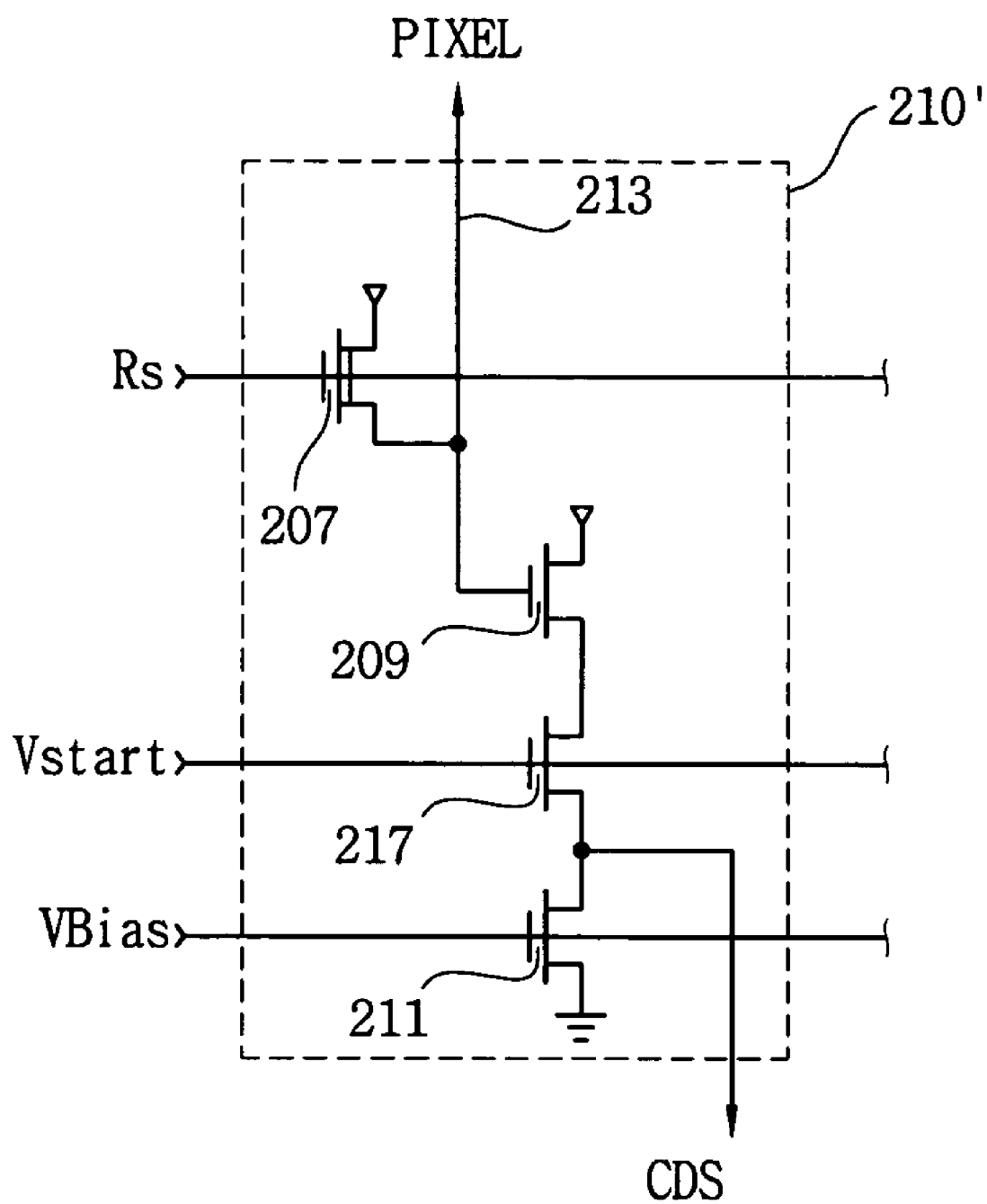
FIG. 5 is a circuit diagram showing a column driver circuit of a CMOS image sensor according to a second exemplary embodiment of the present invention.

FIG. 5 is a circuit diagram showing a column driver circuit 210' of a CMOS image sensor according to a second exemplary embodiment of the present invention.

Referring to FIG. 5, the configuration of the CMOS image sensor is the same as that of the CMOS image sensor of FIG. 2, however, the column driver circuit 210' of this embodiment further includes a selection control circuit 217 that controls the output of the driver circuit 209 by turning on/off the driver circuit 209. The selection control circuit 217 includes a starting transistor. For example, the starting transistor 217 is an enhancement mode NMOS transistor. A drain electrode of the starting transistor 217 is connected to a source electrode of the driver transistor 209, and a source electrode of the starting transistor 217 is connected to the output load (or the bias transistor 211). In addition, an output terminal of the column driver circuit 210' is the source electrode of the starting transistor 217. The gate of the starting transistor 217 receives a start signal Vstart.

The start signal Vstart is applied such that the starting transistor 217 remains in a turned-on state during the reset operation, and such that the starting transistor 217 remains in the turned-on state when the data voltage is being output after the reset operation. The start signal Vstart is applied such that the starting transistor 217 is turned off when the output of the data voltage and sampling of the data voltage by the correlated double sampling circuit are complete, and to initialize the output voltage of the column driver circuit 210'.

Figure 6:
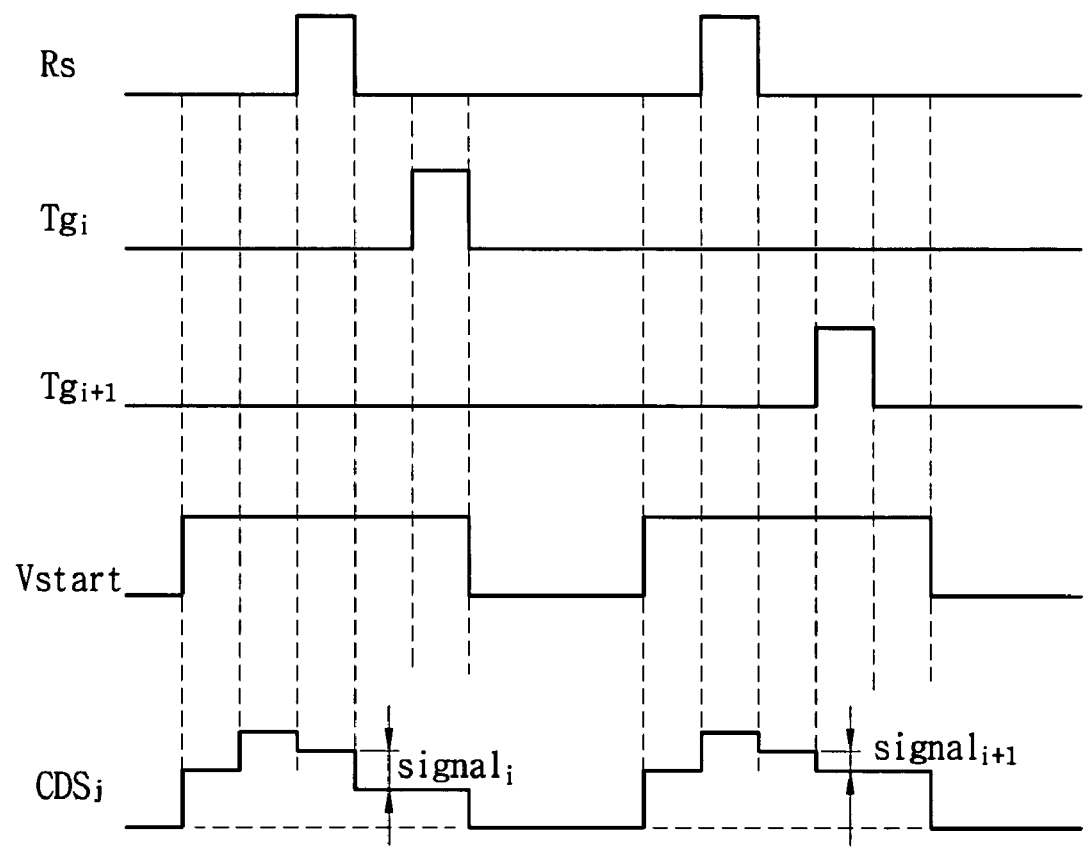
FIG. 6 is a timing diagram showing the operation of the CMOS image sensor of FIG. 5.

FIG. 6 is a timing diagram showing the operation of the CMOS image sensor of FIG. 5.

Referring to FIG. 6, when the reset signal Rs becomes a high level after the starting transistor 217 is turned on, the reset transistor 207 is turned on. As described in detail in Embodiment 1, the sensing node 201 of each pixel 200 is reset, and the voltages of the sensing nodes 201 become the power voltage Vdd.

The voltage of sensing node 201 is output as the reference voltage via the associated driver transistor 209 and the starting transistor 217 of the column driver circuit 201'. The starting transistor 217 operates in a triode region in order that the reference voltage may be output. Namely, the channel area approximate to a drain region of the starting transistor 217 is not in pinch-off.

In addition, since the driver transistor 209 and the bias transistor 211 operate in the saturation region, the size of the starting transistor 217 is relatively large in order that the current flowing through the driver transistor 209 and the bias transistor 211 in the saturation region may be substantially the same as the current flowing through the starting transistor 217 in the triode region. In other words, the area of the source/drain region of the starting transistor 217 is larger than that of the driver transistor 209 and the bias transistor 211.

The transfer transistors 205 of the pixels 200 connected to the (i)th row line are turned on in order to select the pixels connected to the (i)th row line.

The data voltages are output according to the transfer transistors 205 being turned on as described in Embodiment 1.

The starting transistors 217 remain in the turned-on state while the data voltages are output.

The respective correlated double sampling circuits (not shown) sample the data voltages while the data voltages are output. The image sensing for the pixels connected to the (i)th row line ends when the starting transistors 217 are turned off. The starting transistors 217 are turned off when gate electrodes of the starting transistors 217 have a low voltage level, and the signal path between the output terminal of the column driver circuits CDSs and the column lines 213 of the image sensor are disconnected. The operation region of the bias transistors 211 varies from the saturation region to the triode region because of the disconnection of the signal path, and the charges accumulated at the capacitors of the correlated double sampling circuits are discharged to the ground via the channel of bias transistors 211.

Thus, the output voltage of a column driver circuit is about 0 volt when the associated starting transistor 217 is turned off, so that the output signal of the column driver circuit CDS is initialized.

Then, the starting transistors 217 are turned on again so as to perform the image sensing operation for the pixels connected to (i+1)th row line, and the image sensing operation is performed on the pixels connected to (i+1)th row line according to above mentioned procedure.

While the exemplary embodiments of the present invention and their advantages have been described in detail, it should be understood that various changes, substitutions and alterations may be made herein without departing from the scope of the invention.

We claim:

1. An image sensor, comprising:
   a plurality of row lines;
   a plurality of column lines crossing the plurality of row lines;
   a plurality of pixels, each of the pixels formed at a respective crossing of one of the plurality of row lines with one of the plurality of column lines, each of the pixels generating a charge based on light incident thereon and selectively transferring the charge to the respective column line in response to a single signal without receiving additional control signals, the single signal being received from the respective row line, and each of the pixels including only a photoelectric transformation element and a switching element; and
   a plurality of column driver circuits, each column driver circuit associated with one of the column lines and configured to generate an output voltage based on the charge on the associated column line, each of the plurality of column driver circuits including,
      a driver circuit including a drive transistor having a first electrode, a second electrode and a gate, the first electrode being connected to a supply voltage, the second electrode connected to a start circuit, and the gate controlling operation of the drive transistor based on the charge on the associated column line;
      the start circuit including a start transistor connected between the drive transistor and an active load, with an output of the start transistor to the active load serving as an output of the column driver circuit; and
      the active load including a load transistor connected between the start transistor and ground, wherein
      the drive transistor, the load transistor and the start transistor are enhancement mode transistors, and
      the start transistor is larger in size than the drive transistor and the load transistor.

2. The image sensor of claim 1, wherein each pixel further comprises:
   a transfer circuit configured to transfer the charge to the respective column line based on the single signal, the single signal being received from the respective row line, the transfer circuit including the switching element, wherein
   the photoelectric transformation element converts incident light into a charge.

3. The image sensor of claim 2, wherein the photoelectric transformation element includes a photo diode.

4. The image sensor of claim 2, wherein the switching element is a transistor and the transfer circuit is the transistor connected between the photoelectric transformation element and the respective column line and having a gate connected to the respective row line.

5. The image sensor of claim 4, wherein the transistor is a depletion mode NMOS transistor.

6. The image sensor of claim 1, wherein,
   the driver circuit is configured to generate a voltage based on the charge on the respective column line; and
   the active load is connected between an output of the driver circuit and ground.

7. The image sensor of claim 6, wherein the second electrode of the drive transistor serves as an output of the column driver circuit and connected to the active load.

8. The image sensor of claim 7, wherein the load transistor is connected between the drive transistor and the ground.

9. The image sensor of claim 6, wherein each of the column driver circuits further comprise:
a reset circuit configured to selectively reset the charge of each pixel associated with the associated column line.

10. The image sensor of claim 9, wherein the reset circuit includes a transistor connected between a supply voltage and the associated column line.

11. The image sensor of claim 10, wherein the transistor of the reset circuit is a depletion mode NMOS transistor.

12. The image sensor of claim 6, wherein the driver circuit generates a reference voltage when a reset circuit resets the charge of each pixel associated with the associated column line.

13. The image sensor of claim 6, wherein the start circuit is configured to selectively output the generated voltage as an output of the column driver circuit.

14. The image sensor of claim 1, wherein the column driver circuit is configured to reset the charge of each pixel associated with the associated column line.

15. The image sensor of claim 1, wherein one column driver circuit is associated with each of the column lines.

16. An image sensor, comprising:
a plurality of row lines;
a plurality of column lines crossing the plurality of row lines;
a plurality of pixels, each of the pixels formed at a respective crossing of one of the plurality of row lines with one of the plurality of column lines, each of the pixels generating a charge based on light incident thereon and selectively transferring the charge to the respective column line in response to a single signal without receiving additional control signals, the single signal being received from the respective row line, and each of the pixels including only a photoelectric transformation clement and a switching element;
a plurality reset circuits, one reset circuit being associated with each of the column lines and configured to reset the charge of each pixel associated with the associated column line; and
a plurality of column driver circuits associated with the plurality of column lines, each of the column driver circuits including,
a driver circuit including a drive transistor having a first electrode, a second electrode and a gate, the first electrode being connected to a supply voltage, the second electrode connected to a start circuit, and the gate controlling operation of the drive transistor based on the charge on the associated column line;
the start circuit including a start transistor connected between the drive transistor and an active load, with an output of the start transistor to the active load serving as an output of the column driver circuit; and
the active load including a load transistor connected between the start transistor and ground, wherein
the drive transistor, the load transistor and the start transistors are enhancement mode transistors, and
the start transistor is larger in size than the drive transistor and the load transistor.

17. The image sensor of claim 16, wherein each reset circuit includes a transistor connected between a supply voltage and the associated column line.

18. The image sensor of claim 17, wherein the transistor of the reset circuit is a depletion mode NMOS transistor.

19. An image sensing method, comprising:
selectively applying a plurality of voltages to a plurality of column lines of an image sensor in response to a single signal without receiving additional control signals, the single signal being received from each of a plurality of row lines, the plurality of voltages based on charges generated by a plurality of pixels of the image sensor, and each of the pixels including only a photoelectric transformation element and a switching clement;
generating, for each column line, a data voltage as an output voltage based on the applied voltage, the generating including,
a driver circuit including a drive transistor having a first electrode, a second electrode and a gate, the first electrode being connected to a supply voltage, the second electrode connected to a start circuit, and the gate controlling operation of the drive transistor based on the charge on the associated column line;
the start circuit including a start transistor connected between the drive transistor and an active load, with an output of the start transistor to the active load serving as an output of the generating; and
the active load including a load transistor connected between the start transistor and ground, wherein
the drive transistor, the load transistor and the start transistors are enhancement mode transistors, and
the start transistor is larger in size than the drive transistor and the load transistor.

20. The method of claim 19, further comprising:
resetting the charge of each pixel prior to the selectively applying.

21. The method of claim 20, wherein the resetting step simultaneously resets the charge of each pixel.

22. The method of claim 20, wherein the resetting step includes applying a supply voltage to each column line to reset the charge of each pixel.

23. The method of claim 20, further comprising:
generating a reference voltage as the output voltage after the resetting step.

24. The method of claim 23, wherein the generating a reference voltage step generates the reference voltage until the applying step.

25. The method of claim 20, further comprising:
repeating the resetting, applying and generating steps for each row of pixels in the image sensor.

26. The method of claim 20, further comprising:
initializing the output voltage.

* * * * *